(12) United States Patent
Aminpur et al.

(10) Patent No.: US 7,005,380 B2
(45) Date of Patent: Feb. 28, 2006

(54) SIMULTANEOUS FORMATION OF DEVICE AND BACKSIDE CONTACTS ON WAFERS HAVING A BURIED INSULATOR LAYER

(75) Inventors: Massud Aminpur, Dresden (DE); Gert Burbach, Dresden (DE); Christian Zistl, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 156 days.

(21) Appl. No.: 10/446,974

(22) Filed: May 28, 2003

(65) Prior Publication Data

US 2004/0121599 A1    Jun. 24, 2004

(30) Foreign Application Priority Data

Dec. 23, 2002    (DE) ............... 102 60 616

(51) Int. Cl.
  *H01L 21/302* (2006.01)
(52) U.S. Cl. .............. 438/689; 438/706; 438/719; 438/723; 438/724; 438/740; 438/743; 438/744; 438/756; 438/757; 438/960
(58) Field of Classification Search .............. 438/149, 438/151, 153, 154, 706, 719, 723, 724, 743, 438/744, 960
See application file for complete search history.

(56) References Cited

U.S. PATENT DOCUMENTS

| 5,965,917 | A |   | 10/1999 | Maszara et al. ............ 257/347 |
| 6,143,646 | A | * | 11/2000 | Wetzel ........................ 438/637 |
| 6,211,059 | B1 | * | 4/2001 | Inoue et al. ................. 438/620 |
| 6,372,562 | B1 | * | 4/2002 | Matsumoto .................. 438/164 |
| 6,468,915 | B1 | * | 10/2002 | Liu ............................. 438/706 |
| 6,632,710 | B1 | * | 10/2003 | Takahashi .................... 438/149 |
| 6,667,518 | B1 | * | 12/2003 | Christensen et al. ........ 257/350 |
| 6,720,242 | B1 | * | 4/2004 | Burbach et al. ............ 438/586 |

OTHER PUBLICATIONS

Wolf, Silicon Processing for the VLSI Era, 1990, Lattice Press, vol. 2, p. 274.*
Wolf, Silicon Processing for the VLSI Era, 2002, Lattice Press, vol. 4, pp. 244-245, 249, 639.*
Wolf, Silicon Processing for the VLSI Era, 2002, Lattice Press, vol. 4, pp. 501-502.*

* cited by examiner

*Primary Examiner*—Nadine G. Norton
*Assistant Examiner*—Eric B. Chen
(74) *Attorney, Agent, or Firm*—Williams, Morgan & Amerson, P.C.

(57) ABSTRACT

A semiconductor device manufacturing method is provided where a device structure is formed on top of a wafer that comprises a backside semiconductor substrate, a buried insulator layer and a top semiconductor layer. Then, an etch stop layer is formed upon the wafer that carries the device structure, and a window is formed in the etch stop layer. Further, a dielectric layer is formed upon the etch stop layer that has the window. Then, a first contact hole through the dielectric layer and the window down to the backside semiconductor substrate is simultaneously etched with at least one second contact hole through the dielectric layer down to the device structure. The wafer may be a silicon-on-insulator (SOI) wafer, and the etch stop layer and the dielectric layer may be formed by depositing silicon oxynitride and tetraethyl orthosilicate (TEOS), respectively. The device structure may be a CMOS transistor structure.

29 Claims, 5 Drawing Sheets

SIMULTANEOUS FORMATION OF DEVICE AND BACKSIDE CONTACTS ON WAFERS HAVING A BURIED INSULATOR LAYER

BACKGROUND OF THE INVENTION

1. Field of the Invention

The invention generally relates to semiconductor devices and manufacturing processes, and, more particularly, to methods of manufacturing semiconductor devices using wafers having a buried insulator layer such as silicon-on-insulator (SOI) wafers.

2. Description of the Related Art

In the manufacturing of semiconductors devices, SOI wafers or substrates are used to provide superior isolation between adjacent devices in an integrated circuit as compared to devices built into bulk wafers. SOI substrates are silicon wafers with a thin layer of oxide or other insulators buried in it. Devices are built into a thin layer of silicon on top of the buried oxide. The superior isolation thus achieved may eliminate the "latch-up" in CMOS devices and further reduces parasitic capacitances. In addition to the buried oxide layer, shallow trench isolations (STI) are often used to completely isolate transistors or other devices from each other.

Since the backside silicon substrate is completely decoupled from the devices, by means of the buried oxide, the voltage potential of the backside substrate tends to float during the operation of the circuit. This might influence the performance of the circuit and reduce the operation reliability.

To prevent the backside silicon substrate of the device from floating, dedicated contacts are formed to connect the backside substrate to a metal layer that has a defined potential. This conventional technique is illustrated in FIGS. 1a and 1b.

Turning first to FIG. 1a, an SOI structure is shown that comprises a backside silicon substrate 100, a buried oxide layer 105 and a top silicon layer 110. Transistor structures 135, 140 are formed on top of the SOI structure. As is apparent from FIG. 1a, the top silicon layer 110 has isolation trenches 145, 150, 155 to decouple the transistor structures 135, 140 from each other and from further devices.

On top of the top silicon layer 110, the isolation trenches 145, 150, 155 and the transistor structures 135, 140, a silicon oxynitride (SiON) layer 120 is deposited that is used in subsequent etch processes as a stop layer. Further, between this etch stop layer 120 and the top silicon layer 110, suicides 115 may be formed.

Further, a TEOS (tetraethyl orthosilicate) layer 125 is deposited as a masking layer. Then, after the transistor structures 135, 140 and the contact stack of silicon oxynitride (SiON) and TEOS are formed, a resist layer 130 is patterned to provide a backside contact mask having an opening 160 for etching a contact to the backside silicon substrate 100.

Once the backside contact mask pattern is defined in the resist layer 130, the stack of tetraethyl orthosilicate (TEOS), silicon oxynitride (SiON), STI material and buried oxide is etched down to the backside silicon substrate 100. By this etching, a contact hole 165 is formed as shown in FIG. 1b. As is apparent from the figure, the isolation trench 145 is divided into two parts 170, 175 by forming the contact hole 165. The resist will now be removed by a plasma strip and an additional wet clean step.

Once the backside contact hole 165 has been formed, the formation of the contacts to connect the transistor structures 135, 140 takes place. This will require another resist layer pattern process and a separate etch step. Thus, the conventional technique involves a dual contact approach that requires a significant total etch process time and, thus, leads to high manufacturing costs.

SUMMARY OF THE INVENTION

An improved semiconductor device manufacturing method is provided that may be used to more efficiently provide a contact to the backside substrate and reduce the costs of manufacturing the devices. In one embodiment, the method comprises forming a device structure onto a wafer, wherein the wafer comprises a backside semiconductor substrate, a buried insulator layer and a top semiconductor layer. The method further comprises forming an etch stop layer upon the wafer carrying the device structure, forming a window in the etch stop layer and forming a dielectric layer upon the etch stop layer having the window formed therein. The method further comprises simultaneously etching a first contact hole through the dielectric layer and the window down to the backside semiconductor substrate and at least one second contact hole through the dielectric layer down to the device structure.

In another embodiment, the method comprises forming a device structure onto an SOI wafer. The SOI wafer comprises a backside silicon substrate, a buried insulator layer and a top silicon layer. The method further comprises depositing a layer of silicon oxynitride upon the SOI wafer carrying the device structure, forming a window in the layer of silicon oxynitride and depositing a layer of tetraethyl orthosilicate (TEOS) upon the layer of silicon oxynitride having the window formed therein. The method further comprises simultaneously etching a first contact hole through the layer of TEOS and the window down to the silicon substrate and at least one second contact hole through the layer of TEOS down to the device structure.

BRIEF DESCRIPTION OF THE DRAWINGS

The invention may be understood by reference to the following description taken in conjunction with the accompanying drawings, in which like reference numerals identify like elements, and in which.

Figure 1A:
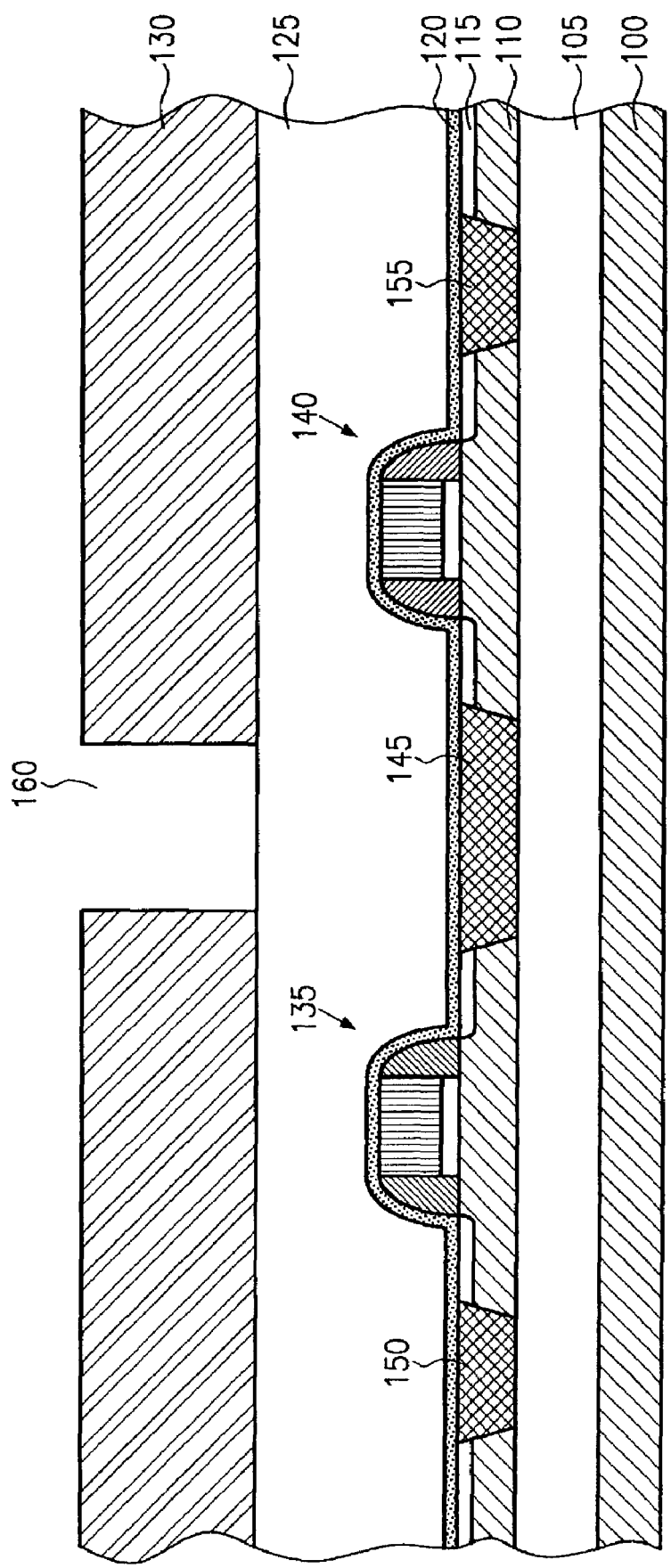
FIGS. 1a and 1b are cross-sectional views of an SOI device structure in different manufacturing process steps for illustrating the conventional technique of forming a contact to the backside silicon substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
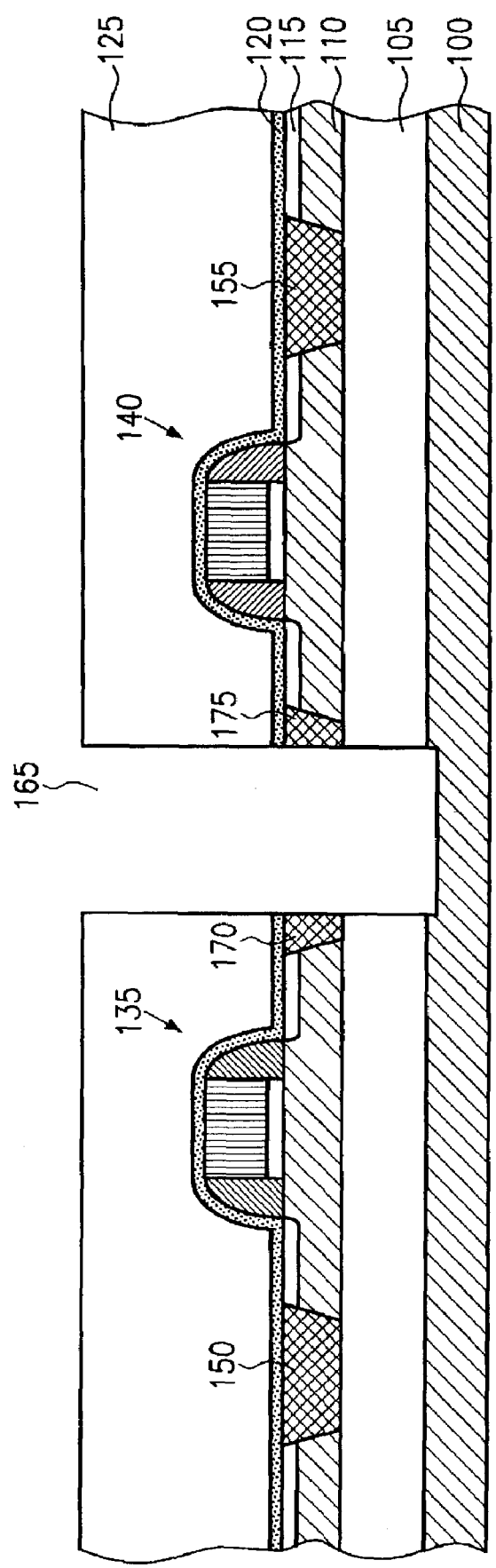
Figure 2A:
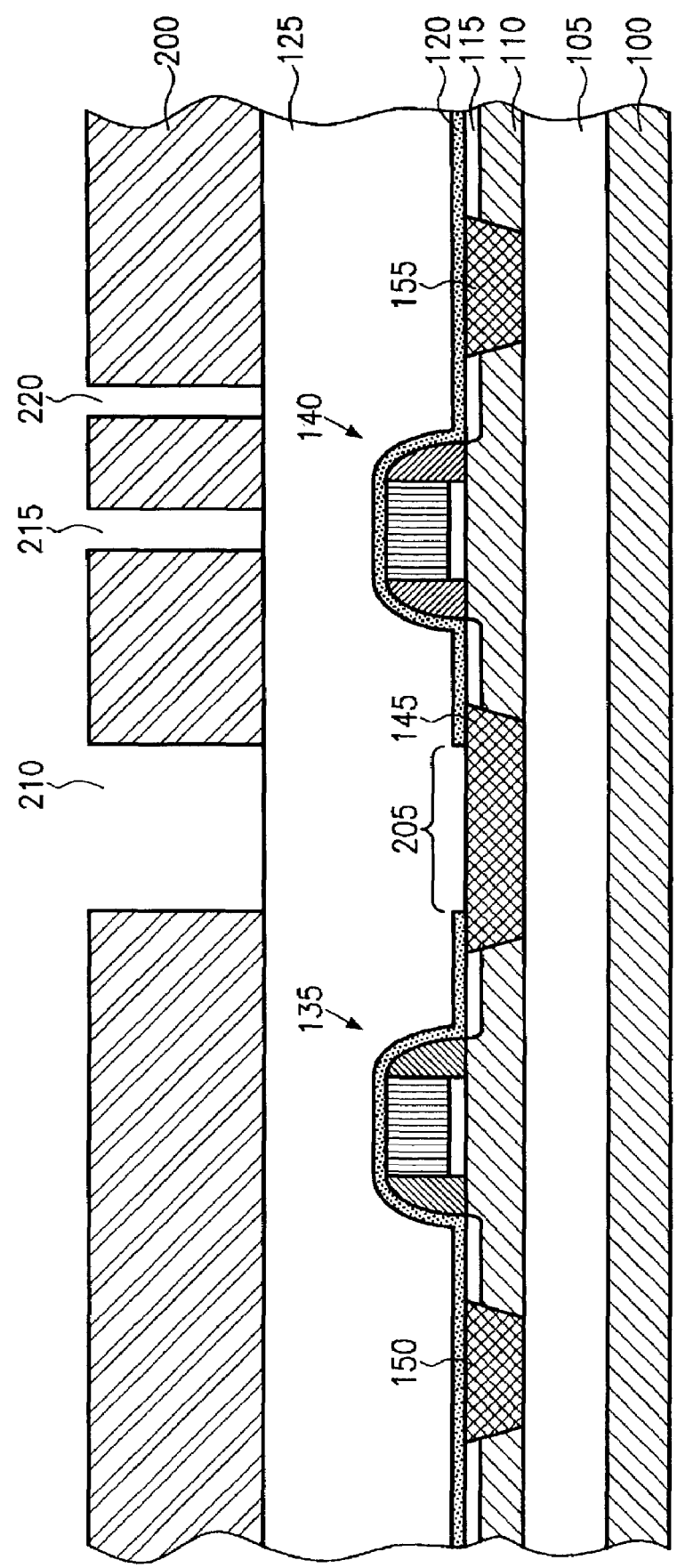
FIGS. 2a and 2b are corresponding cross-sectional views for illustrating the manufacturing process according to one illustrative embodiment of the present invention.
Figure 2B:
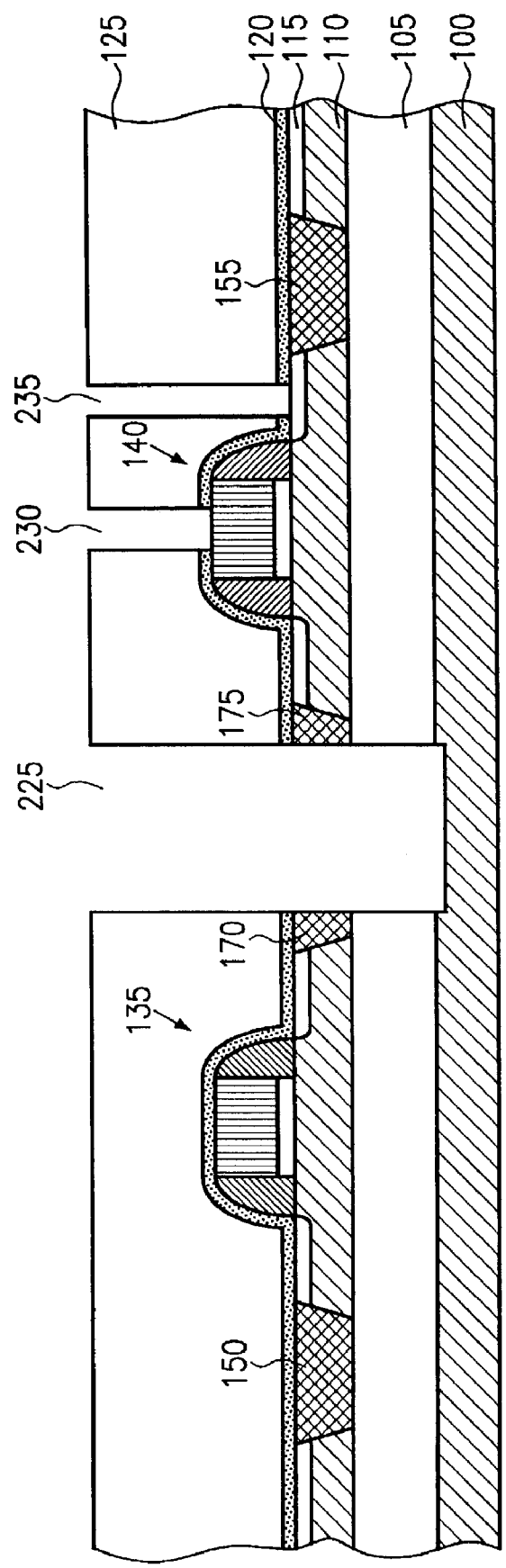

Referring now to the drawings, and particularly to FIGS. 2a and 2b, cross-sectional views similar to those shown in FIGS. 1a and 1b are provided. As may be seen from FIG. 2a, an SOI structure 100, 105, 110 having isolation trenches 145, 150, 155 in the top silicon layer 110 has transistor structures 135, 140 formed thereon.

After the transistor structures 135, 140 have been formed and the etch stop layer 120, which may be of silicon oxynitride (SiON), is deposited, a resist mask (not shown) and a subsequent etch step are utilized to pattern a window 205 into the etch stop layer 120. The window 205 is formed to define the location where the backside silicon substrate 100 is to be contacted. The window 205 may be of any horizontal shape, i.e., circular, oval, square or rectangular.

As is apparent from FIG. 2a, the window 205 is formed on top of the isolation trench 145 that electrically decouples the device substructures 135, 140 from each other.

After having formed the window 205 into the etch stop layer 120, the dielectric layer 125 is deposited, which may be of tetraethyl orthosilicate (TEOS). Then, the resist mask 200 is patterned by a lithography step. As is apparent from FIG. 2a, the resist mask 200 is patterned to have openings 210, 215, 220 for defining the contact to the backside silicon substrate 100 as well as contacts to terminals of a transistor structure. Such terminals may be a gate or poly-gate, source and drain terminals.

Once the numerous contacts have thus been defined in one resist mask, contact holes 225–235 to the backside silicon substrate 100 and the transistor terminals are etched, resulting in the structure shown in FIG. 2b. In this depiction, the resist layer 200 has already been removed, for example, by a plasma strip and an additional wet clean step.

As shown in FIG. 2b, a contact hole 225 is etched through the stack of the tetraethyl orthosilicate (TEOS) layer, the etch stop layer 120, the STI material that formed the isolation trench 145, and the buried insulator 105 that is located between the backside silicon layer 100 and the top silicon layer 110. Thus, the contact hole 225 is formed through the window 205 that had been opened in an earlier process step.

Since the window 205 was formed on top of the isolation trench 145 that electrically decouples the device substructures 135, 140 from each other, the isolation trench 145 is divided into two parts 170, 175 by forming the contact hole 225.

The contact holes 230, 235 that are formed simultaneously with the formation of the contact hole 225 are etched through the stack of the tetraethyl orthosilicate (TEOS) layer and the etch stop layer 120. The contact holes 230, 235 are to reach contact terminals of the device substructures 135, 140 such as the gate, source or drain contacts of transistors, or the like.

It is to be noted that the horizontal shape of each of the contact holes 225–235 may be chosen to follow the respective requirements of the chip layout. The shapes may in principal have arbitrary contours, but it is to be noted that, in one embodiment, the shape of the contact hole 225 is substantially the same as the shape of the window 205 through which the contact hole 225 is formed.

It can be seen from studying FIGS. 2a and 2b that the depicted embodiment provides a method for forming a backside substrate contact simultaneously with the contact etch step that connects the gate, source, etc. to the upper metal layers. Thus, the invention advantageously avoids the necessity of an extra lithography and etch step for forming the backside contacts. This significantly reduces the overall manufacturing costs since the total etch time and the complexity are reduced.

In the above embodiment, the semiconductor used is silicon. In other embodiments, other semiconductors, such as germanium, gallium arsenide, or organic semiconductors, may be used.

While, in the above embodiment, the etch stop layer 120 was described as being formed by depositing silicon oxynitride, it is to be noted that other dielectric materials may be used, such as silicon nitride (e.g., $Si_3N_4$), provided the material is different enough in structure compared with the other materials used in the structure such that subsequent etching processes are capable of etching through the other layers while essentially stopping at the etch stop layer.

Moreover, the above embodiments are not restricted to the use of tetraethyl orthosilicate (TEOS) in layer 125. Rather, any other suitable dielectric material may be used.

The buried insulator layer 105 may be an oxide, e.g., silicon dioxide, but may in other embodiments be made of any other insulating material, such as silicon nitride.

As mentioned above with reference to FIGS. 1a and 1b, a layer 115 of suicides may be formed between the top silicon layer 110 and the etch stop layer 120 (see FIGS. 2a and 2b). Silicides are typically titanium silicides or cobalt silicides, but may also be formed using other metals, including tantalum, nickel, tungsten, molybdenum and platinum.

Moreover, it is to be noted that the invention is not restricted to the use of any specific kind of resist. Rather, positive, as well as negative, photoresist may be used to define the various patterns.

In the above embodiments, the device substructures 135, 140 have been described to be transistor structures. In these embodiments, the transistor structures are built using the CMOS technique. It is, however, to be noted that other transistor structures may be used instead, including transistor structures that are built using other MOS (metal oxide semiconductor) or MIS (metal insulator semiconductor) techniques, or even bipolar transistor structures. Moreover, other embodiments exist where the device structures 135, 140 do not contain transistors but other integrated electronic devices, active or passive, including diodes, capacitors or resistors.

Figure 3:
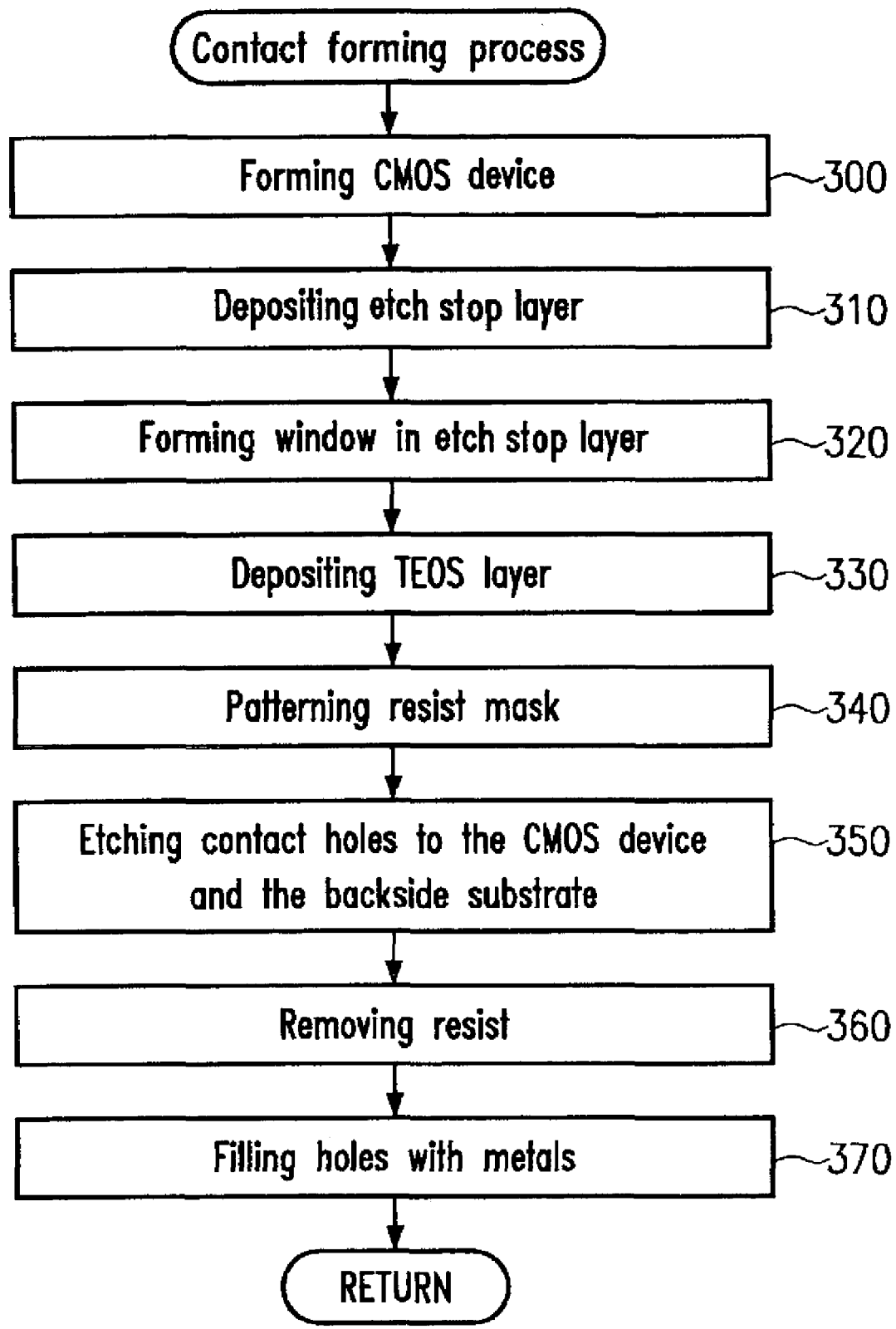
FIG. 3 is a flowchart for illustrating the contact formation process according to one illustrative embodiment of the present invention.

Given these explanations, FIG. 3 is a flowchart illustrating the contact formation process discussed so far with reference to FIGS. 2a and 2b. In step 300, a CMOS device or any other device structure 135, 140 is formed. Then, an etch stop layer 120 comprised of, for example, silicon oxynitride, is deposited. Further, a window 205 is formed in the etch stop layer in step 320, and the insulating layer 125 is deposited in step 330 to cover the entire topography which has been formed so far. After patterning the resist mask 200 in step 340, one or more contact holes 230, 235 to the CMOS device formed in step 300 and a contact hole 225 to the backside substrate 100 are simultaneously etched in step 350. The resist 200 is then removed in step 360, e.g., by a plasma strip and an additional wet clean step, so that the contact holes can be filled with metals in step 370.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing a semiconductor device, comprising:
   forming a device structure onto a wafer, said wafer comprising a backside semiconductor substrate, a buried insulator layer and a top semiconductor layer;
   forming an etch stop layer upon said wafer above said top semiconductor layer and said device structure;
   forming a window in said etch stop layer;
   forming a dielectric layer upon said etch stop layer having said window formed therein; and
   simultaneously etching a first contact hole through said dielectric layer and said window in said etch stop layer down to said backside semiconductor substrate and at least one second contact hole through said dielectric layer and said etch stop layer down to said device structure.

2. The method of claim 1, wherein said semiconductor is silicon and said wafer is a silicon-on-insulator (SOI) wafer.

3. The method of claim 1, wherein said etch stop layer is formed by depositing silicon oxynitride.

4. The method of claim 1, wherein said etch stop layer is formed by depositing Si$_3$N$_4$ silicon nitride.

5. The method of claim 1, wherein said dielectric layer is formed by depositing tetraethyl orthosilicate (TEOS).

6. The method of claim 1, wherein said dielectric layer is formed by depositing silicon dioxide.

7. The method of claim 1, wherein said device structure is a CMOS device structure.

8. The method of claim 1, wherein said buried insulator layer is an oxide layer.

9. The method of claim 1, wherein:
   said device structure comprises a first device substructure and a second device substructure;
   said top semiconductor layer has an isolation trench for electrically decoupling said first and second device substructures; and
   said window is formed on top of said isolation trench.

10. The method of claim 1, wherein said device structure is a transistor structure and said at least one second contact hole is etched down to at least one contact terminal of said transistor structure.

11. The method of claim 10, wherein said transistor structure is a MOS transistor structure and said at least one contact terminal is at least one of the transistor's gate, source or drain terminals.

12. The method of claim 1, wherein said window is formed by etching said etch stop layer using a first resist mask, and said first and second contact holes are etched using a second resist mask.

13. A method of manufacturing a semiconductor device, comprising:
   forming a device structure onto a silicon-on-insulator (SOI) wafer, said SOI wafer comprising a backside silicon substrate, a buried insulator layer and a top silicon layer;
   depositing a layer of silicon oxynitride upon said SOI wafer above said top semiconductor layer and said device structure;
   forming a window in said layer of silicon oxynitride;
   depositing a layer of tetraethyl orthosilicate (TEOS) upon said layer of silicon oxynitride having said window formed therein; and
   simultaneously etching a first contact hole through said layer of TEOS and said window in said layer of silicon nitride down to said backside silicon substrate and at least one second contact hole through said layer of TEOS and said etch stop layer down to said device structure.

14. The method of claim 13, wherein said layer of silicon oxynitride is an etch stop layer.

15. The method of claim 13, wherein said device structure is a CMOS device structure.

16. The method of claim 13, wherein said buried insulator layer is an oxide layer.

17. The method of claim 13, wherein:
   said device structure comprises a first device substructure and a second device substructure;
   said top semiconductor layer has an isolation trench for electrically decoupling said first and second device substructures; and
   said window is formed on top of said isolation trench.

18. The method of claim 13, wherein said device structure is a transistor structure and said at least one second contact hole is etched down to at least one contact terminal of said transistor structure.

19. The method of claim 18, wherein said transistor structure is a MOS transistor structure and said at least one contact terminal is at least one of the transistor's gate, source or drain terminals.

20. The method of claim 13, wherein said window is formed by etching said layer of silicon oxynitride using a first resist mask, and said first and second contact holes are etched using a second resist mask.

21. A method of manufacturing a semiconductor device, comprising:
- forming a device structure onto a wafer, said wafer comprising a backside semiconductor substrate, a buried insulator layer, a top semiconductor layer, and an isolation structure formed in said top semiconductor layer;
- forming an etch stop layer upon said wafer above said top semiconductor layer and said device structure and on said isolation structure;
- forming a window in said etch stop layer above a portion of said isolation structure;
- forming a dielectric layer upon said etch stop layer having said window formed therein; and
- simultaneously etching a first contact hole through said dielectric layer, said window, said isolation structure and said buried insulator layer down to said backside semiconductor substrate and at least one second contact hole through said dielectric layer and said etch stop layer down to said device structure.

22. The method of claim 21, wherein said semiconductor is silicon and said wafer is a silicon-on-insulator (SOI) wafer.

23. The method of claim 21, wherein said etch stop layer is formed by depositing silicon oxynitride.

24. The method of claim 21, wherein said etch stop layer is formed by depositing $Si_3N_4$ silicon nitride.

25. The method of claim 21, wherein said dielectric layer is formed by depositing tetraethyl orthosilicate (TEOS).

26. The method of claim 21, wherein said buried insulator layer is an oxide layer.

27. The method of claim 21, wherein said device structure is a transistor structure and said at least one second contact hole is etched down to at least one contact terminal of said transistor structure.

28. The method of claim 21, wherein said transistor structure is a MOS transistor structure and said at least one contact terminal is at least one of the transistor's gate, source or drain terminals.

29. The method of claim 21, wherein said window is formed by etching said etch stop layer using a first resist mask, and said first and second contact holes are etched using a second resist mask.

* * * * *